(12) United States Patent
Kitamoto (10) Patent No.: US 11,183,798 B2
(45) Date of Patent: Nov. 23, 2021

(54) CONNECTOR DEVICE AND CONNECTOR CONNECTION DETERMINATION DEVICE

(71) Applicant: Honda Motor Co., Ltd., Tokyo (JP)

(72) Inventor: Shinji Kitamoto, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 16/741,743

(22) Filed: Jan. 14, 2020

(65) Prior Publication Data
US 2020/0227868 A1 Jul. 16, 2020

(30) Foreign Application Priority Data
Jan. 15, 2019 (JP) .............................. JP2019-004500

(51) Int. Cl.
*H01R 13/66* (2006.01)
*H01R 13/62* (2006.01)
(Continued)

(52) U.S. Cl.
CPC .......... *H01R 13/6683* (2013.01); *B60L 53/16* (2019.02); *G01R 19/155* (2013.01); *H01R 13/6205* (2013.01); *H01R 2201/26* (2013.01)

(58) Field of Classification Search
CPC ............ H01R 13/6683; H01R 13/6205; H01R 2201/26; H01R 11/30; H01R 13/22;
(Continued)

(56) References Cited

U.S. PATENT DOCUMENTS 3,431,428 A * 3/1969 Van Valer .......... B60H 1/00428
307/10.1
7,351,066 B2 * 4/2008 DiFonzo ............ H01R 13/6205
439/39
(Continued)

FOREIGN PATENT DOCUMENTS

CN 101769977 7/2010
CN 102548790 7/2012
(Continued)

OTHER PUBLICATIONS

"Office Action of China Counterpart Application", dated Jan. 6, 2021, with English translation thereof, pp. 1-21.
(Continued)

*Primary Examiner* — Travis S Chambers
(74) *Attorney, Agent, or Firm* — JCIPRNET (57) ABSTRACT

A connector device is provided, including a vehicle connector and a charging connector which are detachably connected to each other. The vehicle connector has electric power line terminals substantially coplanar with a flat connection surface and a plurality of signal line terminals which are arranged on a radial outside of the electric power line terminals The charging connector has electric power line terminals and a plurality of signal line terminals which are arranged substantially coplanar with a flat connection surface and are respectively in surface contact with the electric power line terminals and the plurality of signal line terminals during the connection with the vehicle connector. The connector connection determination device determines whether a connection state between the two connectors according to a detection result of whether the signal line terminals are in contact with each other when the charging connector is attached to the vehicle connector.

10 Claims, 7 Drawing Sheets

(51) Int. Cl.
  *B60L 53/16* (2019.01)
  *G01R 19/155* (2006.01)

(58) Field of Classification Search
  CPC .. H01R 12/714; H01R 13/24; H01R 13/2421; H01R 13/2407; H01R 13/2414; H01R 24/00; H01R 13/502; H01R 13/627; H01R 13/629; B60L 53/16; G01R 19/155; Y02T 90/14; Y02T 10/7072; Y02T 10/70
  USPC .......................................... 439/39, 289, 488
  See application file for complete search history.

(56) References Cited

U.S. PATENT DOCUMENTS

| | | | | |
|---|---|---|---|---|
| 7,740,499 | B1 * | 6/2010 | Willey | G02B 23/12 439/332 |
| 9,413,087 | B2 * | 8/2016 | Shariff | H01R 11/30 |
| 10,576,832 | B2 * | 3/2020 | Fuchs | H02H 5/042 |
| 2012/0081073 | A1 * | 4/2012 | Niemann | H02G 11/02 320/109 |
| 2014/0065847 | A1 * | 3/2014 | Salmon | G07C 9/00182 439/39 |

FOREIGN PATENT DOCUMENTS

| | | |
|---|---|---|
| CN | 102882073 | 1/2013 |
| JP | 2014-116989 | 6/2014 |
| WO | 2004106952 | 12/2004 |
| WO | 2013076542 | 5/2013 |

OTHER PUBLICATIONS

"Office Action of China Counterpart Application" with English translation thereof, dated Aug. 6, 2021, p. 1-p. 21.

\* cited by examiner

CONNECTOR DEVICE AND CONNECTOR CONNECTION DETERMINATION DEVICE

CROSS REFERENCE TO RELATED APPLICATIONS

This application claims the priority benefit of Japanese Patent Application No. 2019-004500, filed on Jan. 15, 2019. The entirety of the above-mentioned patent application is hereby incorporated by reference herein and made a part of this specification.

BACKGROUND

Technical Field

The disclosure relates to a connector device which is applied to, for example, an electric vehicle, and particularly connects a connector at a side of the vehicle and a connector at a side of a charging device for charging a battery of the vehicle, and relates to a connector connection determination device for determining whether these connectors are appropriately connected to each other.

Related Art

Conventionally, as this type of connector device, for example, a connector device described in patent literature 1 (Japanese Patent Application Laid-open No. 2014-116989) is known. In the connector device, a connector (hereinafter, referred to as a "vehicle connector" in this column) is arranged at a side of a vehicle such as an electric automobile or the like, and a connector for charging (hereinafter, referred to as a "charging connector" in this column) is arranged in a charging device which serves as an external power source. The vehicle connector includes two vehicle connectors for normal charging and quick charging which are supplied with power from the charging device, and for example, seven connector pins protruding outward are arranged in the vehicle connector for normal charging.

Specifically, these seven connector pins protrude outward from a flat connection surface of the vehicle connector, a single connector pin (hereinafter, referred to as an "inner side connector pin" in this column) is arranged in a center portion of the connection surface, and the other six connector pins (hereinafter, referred to as "outer side connector pins" in this column) are arranged at a radial outside of the inner side connector pin. A ground line inside the vehicle is connected to the inner side connector pin, and a plurality of electric power lines and signal lines inside the vehicle is connected to the six outer side connector pins. Besides, while charging to the battery inside the vehicle is performed via the electric power line, connection determination of the vehicle connector and the charging connector or the like is performed via the signal lines.

On the other hand, the charging connector is configured to correspond to the vehicle connector to be connected. Specifically, the charging connector includes a plurality of pin holes which is arranged at positions corresponding to the plurality of connector pins and into which each connector pin can be fitted. The pin holes are connected to the charging device via the electric power lines or the signal lines.

When the vehicle connector and the charging connector configured as described above are connected, the charging connector is pressed toward the vehicle connector, and each connector pin at the vehicle connector side is fitted into the corresponding pin hole of the charging connector. In this way, electric power lines and signal lines at a side of the charging device are respectively electrically connected to electric power lines and signal lines at a side of the vehicle via the two connectors.

In the conventional connector device described above, according to a degree of fitting between the vehicle connector and the charging connector, specifically, a degree of fitting of the plurality of pin holes of the charging connector with respect to the plurality of connector pins of the vehicle connector, or a degree of fitting of insertion portions of the charging connector with respect to openings of the vehicle connector, a force for fitting the charging connector or a force for pulling out the charging connector may be required during connection or separation of the two connectors, and in this case, the connection and separation work of the connectors may be complicated.

In addition, in the above connector device, whether the charging connector is connected to the vehicle connector is determined by the single connector pin for connection confirmation at the vehicle connector side being fitted into a corresponding pin hole at the charging connector side. That is, by fitting the connector pins into the pin holes, signal lines for connection determination at the vehicle connector side and corresponding signal lines at the charging connector side are electrically connected, and thereby it is determined that the charging connector is connected to the vehicle connector. However, in the connector device, even if the above connector pins are fitted into the pin holes, when an electrical contact failure occurs, there is a possibility that whether a connection state between the connectors is good or poor cannot be appropriately determined.

The disclosure provides a connector device and a connector connection determination device which can easily connect and separate connectors and can appropriately determine whether a connection state between the connectors is good or poor.

SUMMARY

According to one embodiment of the disclosure, a connector device 1 is provided and includes a first connector and a second connector which are detachably connected to each other, wherein the first connector includes: a first connection surface which faces outward; first electric power line terminals which are arranged on the first connection surface substantially coplanar with the first connection surface; and a plurality of first signal line terminals which is arranged on the first connection surface substantially coplanar with the first connection surface and on a radial outside of the first electric power line terminals; the second connector includes: a second connection surface which faces the first connection surface during the connection to the first connector; second electric power line terminals which are arranged on the second connection surface substantially coplanar with the second connection surface and are in surface contact with the first electric power line terminals during a connection to the first connector; and a plurality of second signal line terminals which is arranged on the second connection surface substantially coplanar with the second connection surface and on a radial outside of the second electric power line terminals, and is in surface contact with the plurality of first signal line terminals respectively during the connection to the first connector.

BRIEF DESCRIPTION OF THE DRAWINGS

FIGS. 7A and 7B are schematic diagrams showing a connector device according to a second embodiment of the disclosure, where

DESCRIPTION OF THE EMBODIMENTS

Figure 1:
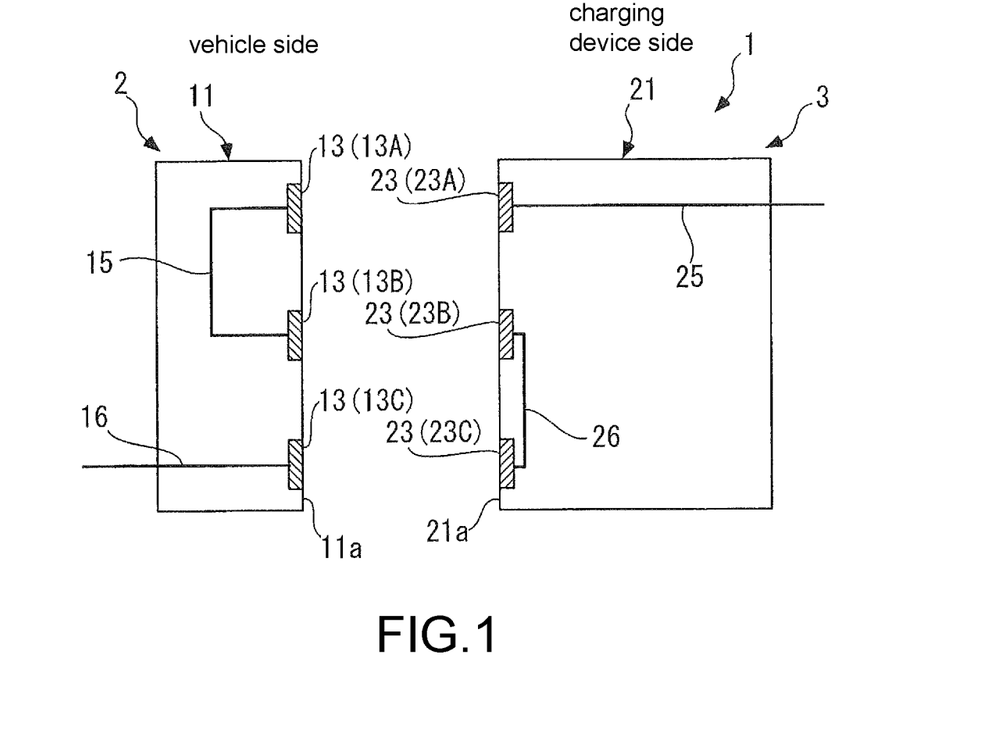
FIG. 1 is a schematic diagram showing a connector device according to a first embodiment of the disclosure and shows a state that a vehicle connector at an electric vehicle side and a charging connector at a charging device side face each other before the two connectors are connected.

Embodiments of the disclosure are specifically described below with reference to the drawings. FIG. 1 schematically shows a connector device to which a connector connection determination device according to a first embodiment of the disclosure is applied. In the connector device 1, for example, a connector (hereinafter, referred to as a "vehicle connector") 2 at a side of an electric vehicle which is not shown and a connector (hereinafter, referred to as a "charging connector") 3 at a side of a charging device for charging a battery of the vehicle are detachably connected to each other.

Furthermore, although detailed description is omitted, the electric vehicle is an electric automobile or a plug-in hybrid automobile which can run using a built-in battery as a power source. In addition, in the charging device, the charging connector 3 (the second connector) is arranged at a distal end portion of a predetermined robot arm, and the charging connector 3 is automatically connected by an operation of the robot arm to the vehicle connector 2 (the first connector) of an electric vehicle parked at a predetermined position near the charging device.

Figure 2A:
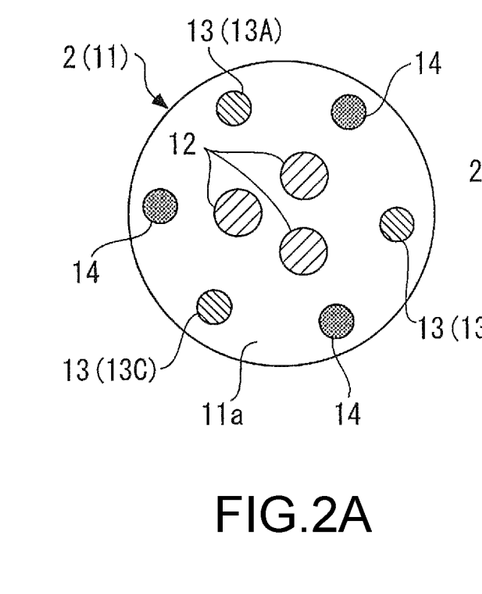
FIG. 2A and FIG. 2B are external views when the vehicle connector and the charging connector are respectively viewed from the side of the other connector.
Figure 2B:
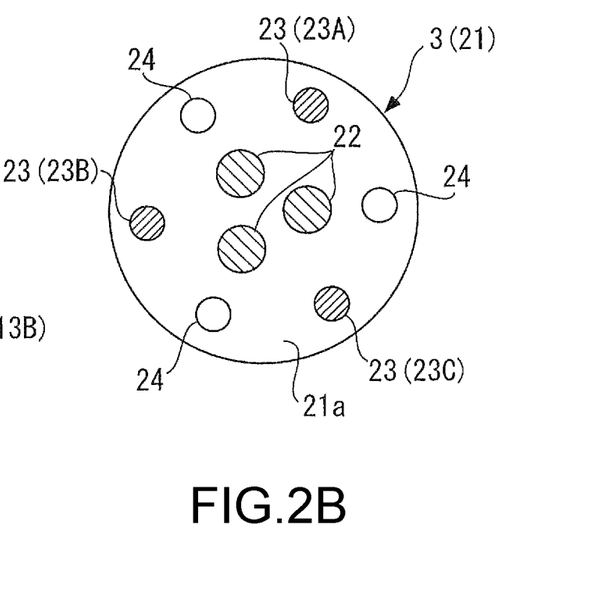

FIG. 2A and FIG. 2B show external views when the vehicle connector 2 and the charging connector 3 are respectively viewed from the side of the other connector. As shown in FIG. 1 and FIG. 2A, the vehicle connector 2 includes a case 11 made of synthetic resin or the like and having an outer shape formed in a cylindrical shape, a plurality (three in the embodiment) of electric power line terminals 12, a plurality (three in the embodiment) of signal line terminals 13, and a plurality (three in the embodiment) of attachment and detachment magnets 14.

As shown in FIG. 2A, the case 11 faces outward and has a flat circular connection surface 11a (a first connection surface), and the three electric power line terminals 12 are arranged at equal angles with each other in a peripheral direction near a center of the connection surface 11a. In addition, each electric power line terminal 12 is arranged in a manner that a distal end portion thereof is configured to be flat and substantially coplanar with the connection surface 11a and faces outward. Furthermore, each electric power line terminal 12 is arranged at an end portion of an electric power line (not shown) which is connected to a battery of the electric vehicle and transmits electric power to the battery during charging.

On the other hand, the three signal line terminals 13 are arranged at equal angles with each other in the peripheral direction near an outer periphery of the connection surface 11a. The signal line terminals 13 may be arranged at a radial outside of the three electric power line terminals 12 on the connection surface 11a, surround the electric power line terminals 12 inside, and be arranged on, for example, a circumference of a circle or a polygon. In addition, similar to the electric power line terminals 12, in each signal line terminal 13, a distal end portion is configured to be flat and substantially coplanar with the connection surface 11a and faces outward.

The above three signal line terminals 13 (hereinafter, appropriately referred to as "a terminal A 13A", "a terminal B 13B" and "a terminal C 13C" to distinguish the signal line terminals) are cooperated with signal line terminals 23 of the charging connector 3 described below and used for determining whether a connection state between the vehicle connector 2 and the charging connector 3 is good or poor. Therefore, the following wiring is made for the three signal line terminals 13. That is, as shown in FIG. 1, the terminal A 13A and the terminal B 13B are electrically connected via an electric wire 15, and the terminal C 13C is connected to an electric wire 16.

In addition, in the case 11 of the vehicle connector 2, similar to the above signal line terminals 13, the above-described three attachment and detachment magnets 14 are fixed at equal angles with each other in a peripheral direction near the outer periphery of the connection surface 11a and in a state that each of the three attachment and detachment magnets 14 is arranged between adjacent signal line terminals 13, 13. Each attachment and detachment magnet 14 is formed in a cylindrical shape, and one end portion having a predetermined magnetic pole faces outward and is configured to be flat and coplanar with the connection surface 11a.

On the other hand, as shown in FIG. 1 and FIG. 2B, the charging connector 3 includes a case 21 which is made of non-magnetic metal or synthetic resin and having an outer shape formed in a cylindrical shape, and electric power line terminals 22, signal line terminals 23 and electromagnets 24 (attraction and repulsion portions) which respectively correspond to and have the same number as the electric power line terminals 12, the signal line terminals 13 and the attachment and detachment magnets 14 of the vehicle connector 2.

As shown in FIG. 2B, the case 21 has a flat circular connection surface 21a (a second connection surface), and three electric power line terminals 22 the same as the above-described electric power line terminals 12 of the vehicle connector 2 are arranged near a center of the connection surface 21a. Each electric power line terminal 22 is arranged in a manner that a distal end portion thereof is configured to be flat and substantially coplanar with the connection surface 21a and faces outward. Furthermore, each electric power line terminal 22 is arranged at an end portion of an electric power line (not shown) which is connected to a power source of the charging device and transmits electric power from the power source during charging.

On the other hand, the three signal line terminals 23 are arranged at equal angles with each other in the peripheral direction near an outer periphery of the connection surface 21a. Similar to the signal line terminals 13 of the vehicle connector 2, the signal line terminals 23 may be arranged at the radial outside of the three electric power line terminals 22 on the connection surface 21a, surround the electric power line terminals 22 inside, and be arranged, for example, on a circumference of a circle or a polygon. Similar to the electric power line terminals 22, in each signal line terminal 23, a distal end portion is configured to be flat and substantially coplanar with the connection surface 21a and faces outward.

In addition, in the above three signal line terminals 23 (hereinafter, appropriately referred to as "a terminal A 23A", "a terminal B 23B" and "a terminal C 23C" to distinguish the signal line terminals), the following wiring is made. That is, as shown in FIG. 1, the terminal A 23A is connected to an electric wire 25, and the terminal B 23B and the terminal C 23C are electrically connected via an electric wire 26.

Furthermore, in the case 21 of the charging connector 3, similar to the above signal line terminals 23, the three electromagnets 24 are fixed at equal angles with each other in a peripheral direction near the outer periphery of the connection surface 21a and in a state that each of the three electromagnets 24 is arranged between adjacent signal line terminals 23, 23. An outer end portion of each electromagnet 24 is configured to be flat and substantially coplanar with the connection surface 21a of the charging connector 3 and faces outward. In addition, each electromagnet 24 is set in such a manner that the outer end portion become the same magnetic pole as an outer magnetic pole of the attachment and detachment magnets 14 of the vehicle connector 2 by energization.

Figure 3:
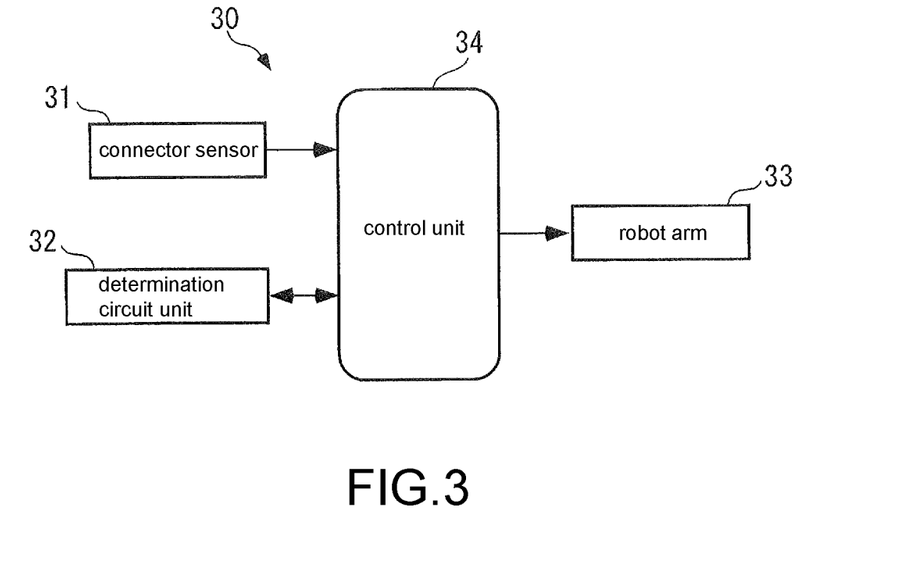
FIG. 3 is a block diagram centering on a control unit in the charging device.

Furthermore, although specific description is omitted, as shown in FIG. 3, for example, the charging device 30 includes a connector sensor 31 which detects a position of the vehicle connector 2 of the electric vehicle to be charged or the like, a determination circuit unit 32 which determines whether a connection state of the charging connector 3 with respect to the vehicle connector 2 is good or poor, a control unit 34 which controls an operation of the robot arm 33 based on a detection result of the connector sensor 31 and a determination result of the connection state between the two connectors 2 and 3, and the like.

Next, with reference to FIG. 1 and FIGS. 4 to 6, an operation of attaching the charging connector 3 to the vehicle connector 2 and an operation of removing the charging connector 3 from the vehicle connector 2 are described. Furthermore, as described above, the charging connector 3 is arranged at a distal end portion of a robot arm 33 of the charging device 30 which can automatically charge the electric vehicle, and in a state that the electric vehicle to be charged is stopped at a predetermined position near the charging device 30, when a charging command is issued to the charging device 30, the operation of attaching the charging connector 3 to the vehicle connector 2 is started.

If the attachment operation of the charging connector 3 is started by the charging command, first, the robot arm 33 is driven, and the charging connector 3 at the distal end portion of the robot arm 33 approaches the vehicle connector 2. Then, if the connection surface 21a of the charging connector 3 approaches the connection surface 11a of the vehicle connector 2, the three electromagnets 24 of the charging connector 3 are respectively attracted by magnetic forces of the three attachment and detachment magnets 14 of the vehicle connector 2.

Figure 4:
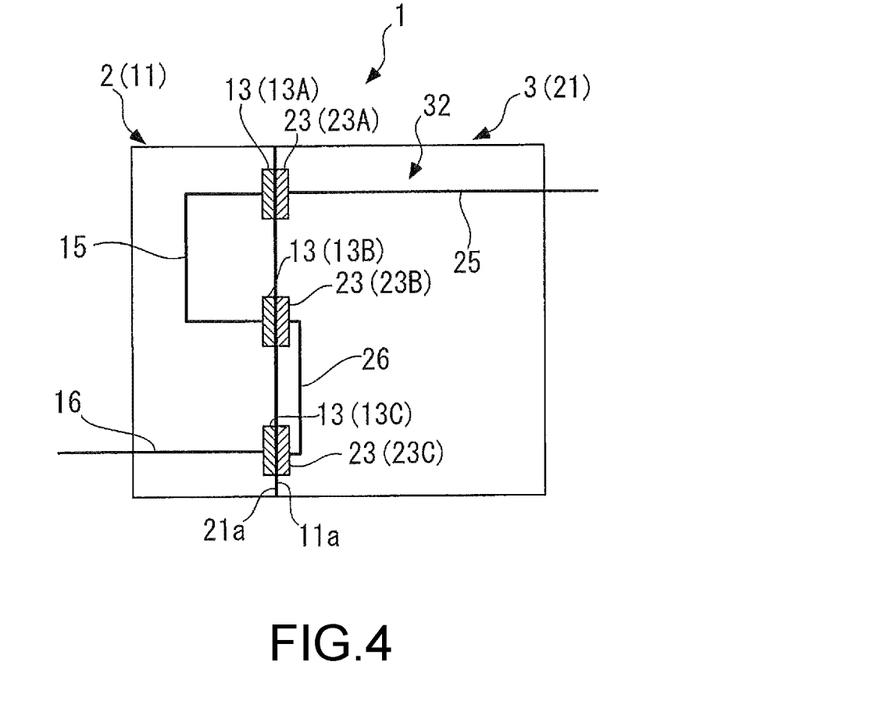
FIG. 4 is a schematic diagram of the connector device showing a state that the vehicle connector and the charging connector are well connected.

FIG. 4 shows a state that the vehicle connector 2 and the charging connector 3 are well connected. Specifically, FIG. 4 shows a state that the three signal line terminals 23 of the charging connector 3, that is, the terminal A 23A, the terminal B 23B and the terminal C 23C are respectively in surface contact with the three signal line terminals 13 of the vehicle connector 2, that is, the terminal A 13A, the terminal B 13B and the terminal C 13C. By contacting the corresponding three signal line terminals 13 and 23 of the two connectors 2 and 3 with each other in this way, the three electric power line terminals 12 of the vehicle connector 2 and the three electric power line terminals 22 of the charging connector 3 which are positioned at inner sides of the signal line terminals 13 and 23 are also in a state of being in surface contact, and charging from the charging device 30 to the battery of the electric vehicle is possible.

In addition, as described above, the three signal line terminals 23 of the charging connector 3 are in contact with the three signal line terminals 13 of the vehicle connector 2, and thereby the determination circuit unit 32 (a first electric circuit) which determines whether the connection state between the two connectors 2 and 3 is good or poor is configured. As shown in FIG. 4, the determination circuit unit 32 is configured as an electric circuit in which the terminals A 13A and 23A, the terminals B 13B and 23B, and the terminals C 13C and 23C which are in contact with each other are connected in series via the electric wires 25, 15, 26 and 16.

Figure 5:
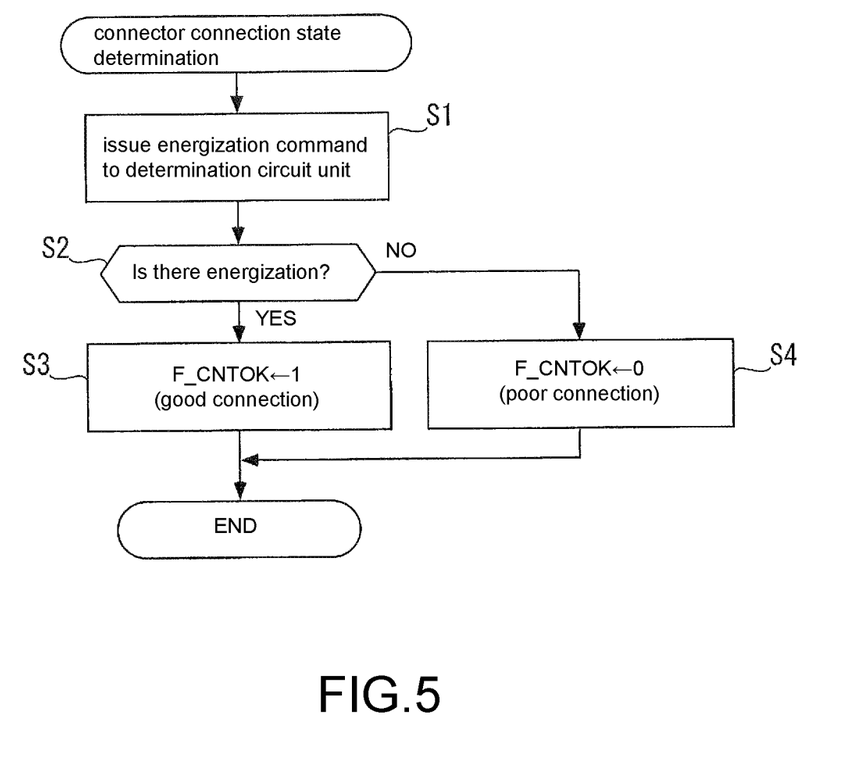
FIG. 5 is a flowchart showing a connection state determination process between the vehicle connector and the charging connector.

As described above, when the charging connector 3 is attached to the vehicle connector 2, the connector connection state determination process for determining whether the connection state between the two connectors 2 and 3 is good or poor is performed repeatedly at a predetermined cycle (for example, 100 ms) by the control unit 34. FIG. 5 shows a flowchart of the connection state determination process of the two connectors 2 and 3. As shown in the diagram, in this process, first, in step 1 (shown as "S1", the same applies hereinafter), an energization command is issued to the determination circuit unit 32. Next, it is determined whether the determination circuit unit 32 is energized (step 2).

When a determination result in step 2 is YES and the determination circuit unit 32 is energized, the three signal line terminals 23 of the charging connector 3 are respectively in appropriate contact with the corresponding three signal line terminals 13 of the vehicle connector 2 (the state shown in FIG. 4). Therefore, the electric power line terminals 22 of the charging connector 3 are also in appropriate contact with the electric power line terminals 12 of the vehicle connector 2, and it is determined that the charging connector 3 is connected at a good state to the vehicle connector 2. Then, in order to express the connection, a connection ok flag F_CNTOK is set to "1" (step 3), and this process is ended. Furthermore, on a condition that the connection ok flag F_CNTOK was "1", the charging from the charging device 30 to the battery of the electric vehicle is started.

On the other hand, when the determination result of the above step 2 is NO, that is, when the determination circuit unit 32 is not energized, at least one of the three signal line terminals 23 of the charging connector 3 is not in contact with the corresponding three signal line terminals 13 of the vehicle connector 2. Therefore, on an assumption that the connection state of the charging connector 3 with respect to the vehicle connector 2 is poor, the connection ok flag F_CNTOK is set to "0" (step 4), and this process is ended.

Figure 6A:
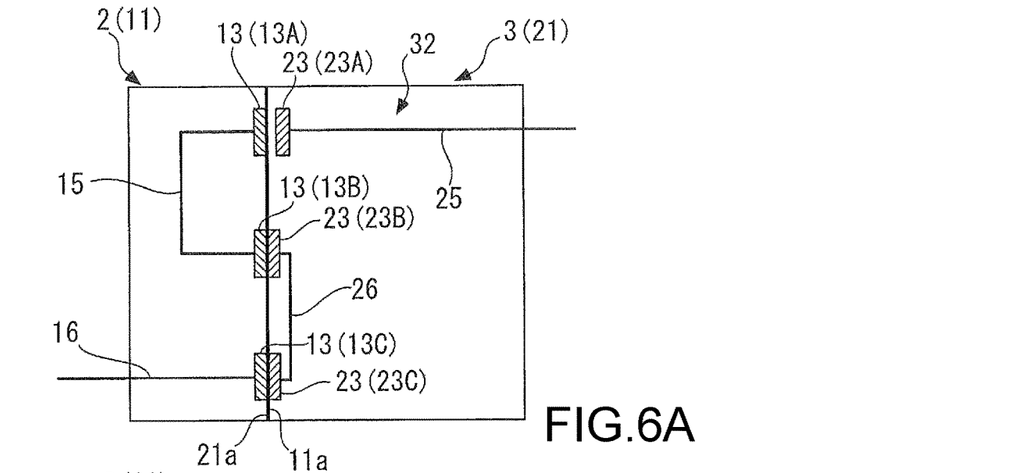
FIGS. 6A to 6C are schematic diagrams of the connector device illustrating a state of a connection failure when the charging connector is attached to the vehicle connector.
Figure 6B:
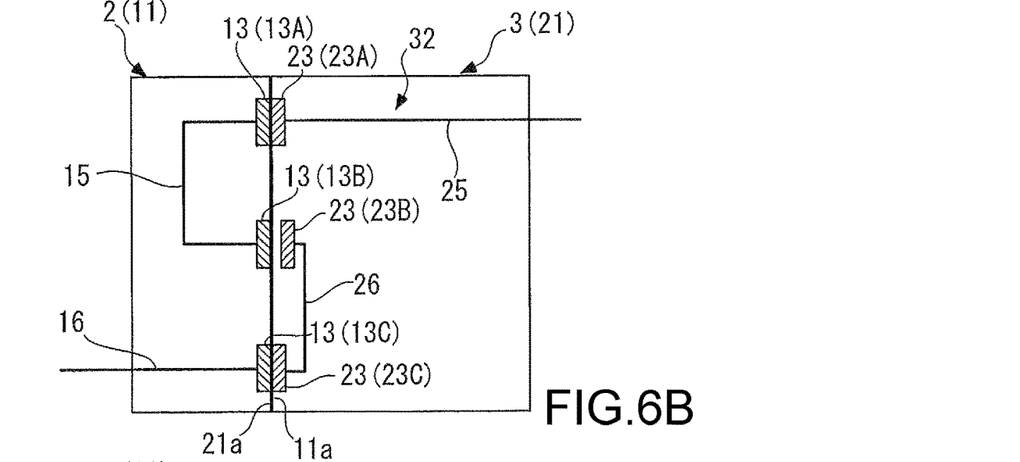
Figure 6C:
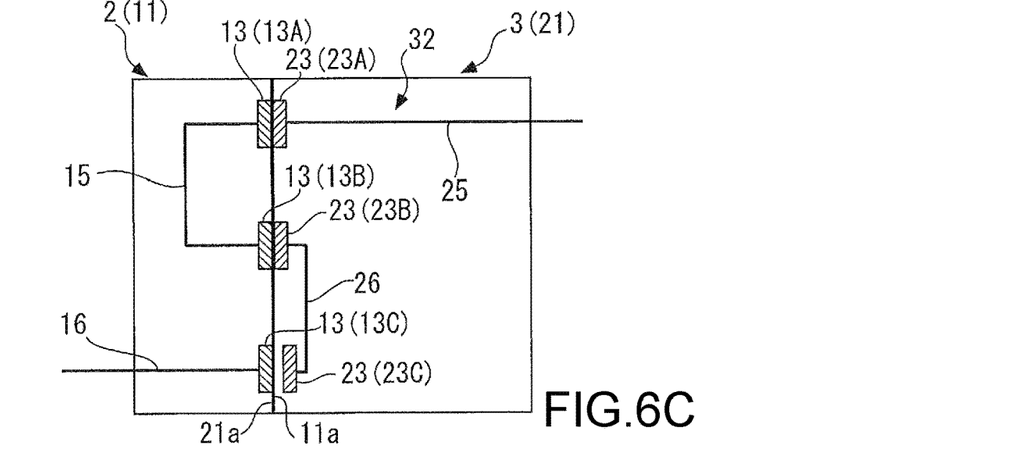

FIGS. 6A to 6C illustrate a state of a connection failure when the charging connector 3 is attached to the vehicle connector 2. Furthermore, in the diagram, for convenience, a state that the connection surface 11a and 21a of the two connectors 2 and 3 abut against each other is shown.

FIG. 6A shows a state that the terminal A 23A of the charging connector 3 is not in contact with the terminal A 13A of the vehicle connector 2, and the terminal B 23B and the terminal C 23C of the charging connector 3 are respectively in contact with the terminal B 13B and the terminal C 13C of the vehicle connector 2. In this example, due to the connection surface 21a of the charging connector 3 abutting against the connection surface 11a of the vehicle connector 2 at a slightly inclined state, it is considered that the charging connector 3 is attached to the vehicle connector 2 in a state that the terminal A 23A of the charging connector 3 is separated from the terminal A 13A of the vehicle connector 2.

Similarly, in FIG. 6B, the charging connector 3 is attached to the vehicle connector 2 in a state that the terminal B 23B of the charging connector 3 is separated from the terminal B 13B of the vehicle connector 2, and in FIG. 6C, the charging connector 3 is attached to the vehicle connector 2 in a state that the terminal C 23C of the charging connector 3 is separated from the terminal C 13C of the vehicle connector 2.

As described above, when the charging connector 3 is attached to the vehicle connector 2, if it is determined that the connection state between the two connectors 2 and 3 is poor, after the charging connector 3 is temporarily removed from the vehicle connector 2 by the robot arm 33, the attachment operation to the vehicle connector 2 is performed again while an angle of the connection surface 21a of the charging connector 3 or the like is adjusted. In this case, the above-described connector connection state determination process is performed immediately after the attachment operation is performed. Then, after it is determined that the connection state between the two connectors 2 and 3 is good, the charging from the charging device 30 to the battery of the electric vehicle is started.

After the charging is ended, the charging connector 3 is removed from the vehicle connector 2 by moving the charging connector 3 in a direction opposite to the vehicle connector 2 by the robot arm 33. In this case, each electromagnet 24 of the charging connector 3 is energized prior to the removal. Accordingly, the outer end portion of each electromagnet 24 has the same magnetic pole as the magnetic pole of the attachment and detachment magnets 14 of the vehicle connector 2 being attracted, and the repulsion forces act between the electromagnets 24 and the attachment and detachment magnets 14. Using the repulsion forces, the charging connector 3 is detached and removed from the vehicle connector 2.

As described above in detail, according to the embodiment, when the charging connector 3 is connected to the vehicle connector 2, the connection surface 21a of the charging connector 3 faces the connection surface 11a of the vehicle connector 2, and the electric power line terminals 22 and the signal line terminals 23 of the charging connector 3 are respectively electrically connected, in a state of being in surface contact, with the electric power line terminals 12 and the signal line terminals 13 of the vehicle connector 2. In addition, because all the three signal line terminals 13 and 23 of the two connectors 2 and 3 are arranged at the radial outside of the electric power line terminals 12 and 22, with the contact between the mutually corresponding three signal line terminals 13 and 23 of the two connectors 2 and 3, the electric power line terminals 12 and 22 of the two connectors 2 and 3 positioned inside the signal line terminals 13 and 23 can be easily and reliably brought into contact with each other in a state of being three-dimensionally positioned. On the other hand, when the charging connector 3 is removed from the vehicle connector 2, by merely moving the charging connector 3 in the direction opposite to the vehicle connector 2, the electric power line terminals 12 and 22 in surface contact with each other and the signal line terminals 13 and 23 in surface contact with each other are easily separated from each other. As described above, according to the embodiment, compared with the conventional connector device, the vehicle connector 2 and the charging connector 3 can be connected and separated easily. In addition, whether the connection state between the two connectors 2 and 3 is good or poor can be easily determined using the determination circuit unit 32.

Next, a connector device to which a connector connection determination device according to a second embodiment of the disclosure is applied will be described with reference to FIGS. 7 to 10. A connector device 41 is different from the connector device 1 of the above first embodiment in that determination circuit units including the signal line terminals 13, 23 are configured for each of the signal line terminals 13, 23 which are in contact with each other when the charging connector 3 is connected to the vehicle connector 2. Furthermore, in the following description, the same components as those of the connector device 1 of the first embodiment described above are denoted by the same symbols, and detailed description thereof is omitted.

Figure 7A:
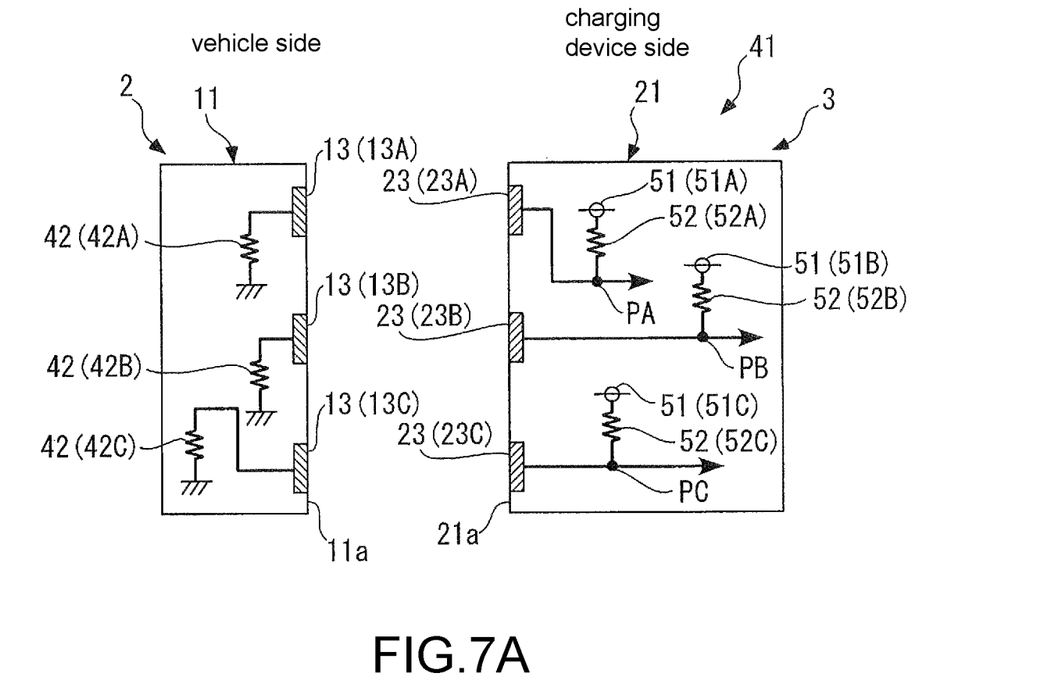
FIG. 7A shows a state before connection of a vehicle connector at an electric vehicle side and a charging connector at a charging device side.

As shown in FIG. 7A, similar to the connector device 1, in the connector device 41, the vehicle connector 2 and the charging connector 3 are detachably connected to each other. All of the three signal line terminals 13 of the vehicle connector 2 are grounded to a metal chassis of the electric vehicle via resistor parts 42 having a predetermined resistance value. Specifically, the terminal A 13A is grounded via a resistor part A 42A, the terminal B 13B is grounded via a resistor part B 42B, and the terminal C 13C is grounded via a resistor part C 42C.

On the other hand, in the charging connector 3, all of the three signal line terminals 23 are connected to power sources 51 having a predetermined voltage (for example, 5 V), and resistor parts 52 having a predetermined resistance value are connected between the signal line terminals 23 and the power sources 51. Specifically, a power source A 51A and a resistor part A 52A are connected to the terminal A 23A, a power source B 51B and a resistor part B 52B are connected to the terminal B 23B, and a power source C 51C and a resistor part C 52C are connected to the terminal C 23C.

Figure 7B:
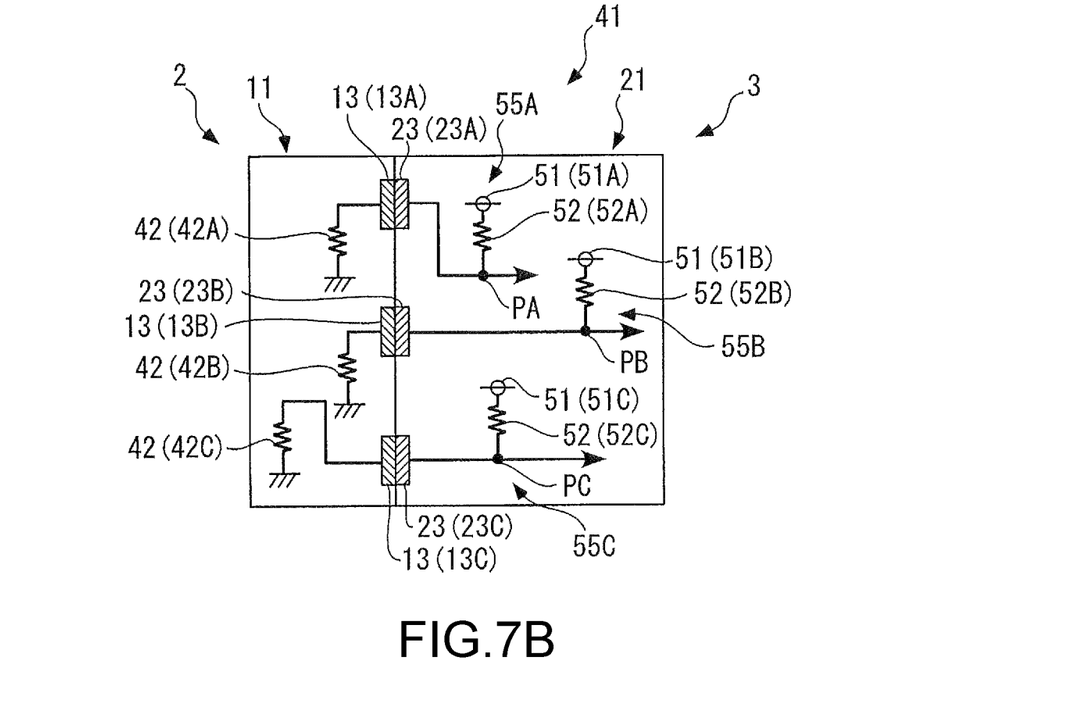
FIG. 7B shows a state that the two connectors are well connected.

In the connector device 41 configured in this way, as shown in FIG. 7B, by the three signal line terminals 23 of the charging connector 3 coming into contact with the three signal line terminals 13 of the vehicle connector 2, three sets of determination circuit units 55 including the signal line terminals 13 and 23 are configured for each of the signal line terminals 13 and 23 which are in contact with each other. Furthermore, in the following description, when the three sets of determination circuit units 55 are to be distinguished, a determination circuit unit including the terminals A 13A and 23A is referred to as a "first determination circuit unit 55A", a determination circuit unit including the terminals B 13B and 23B is referred to as a "second determination circuit unit 55B", and a determination circuit unit including the terminals C 13C and 23C is referred to as a "third determination circuit unit 55C".

Similar to the connector device 1 of the first embodiment described above, in the connector device 41, when the charging connector 3 is attached to the vehicle connector 2, a connector connection state determination process for determining whether the connection state between the two connectors 2 and 3 is good or poor is repeatedly performed at a predetermined cycle (for example, 100 ms) by the control unit 34.

Figure 8:
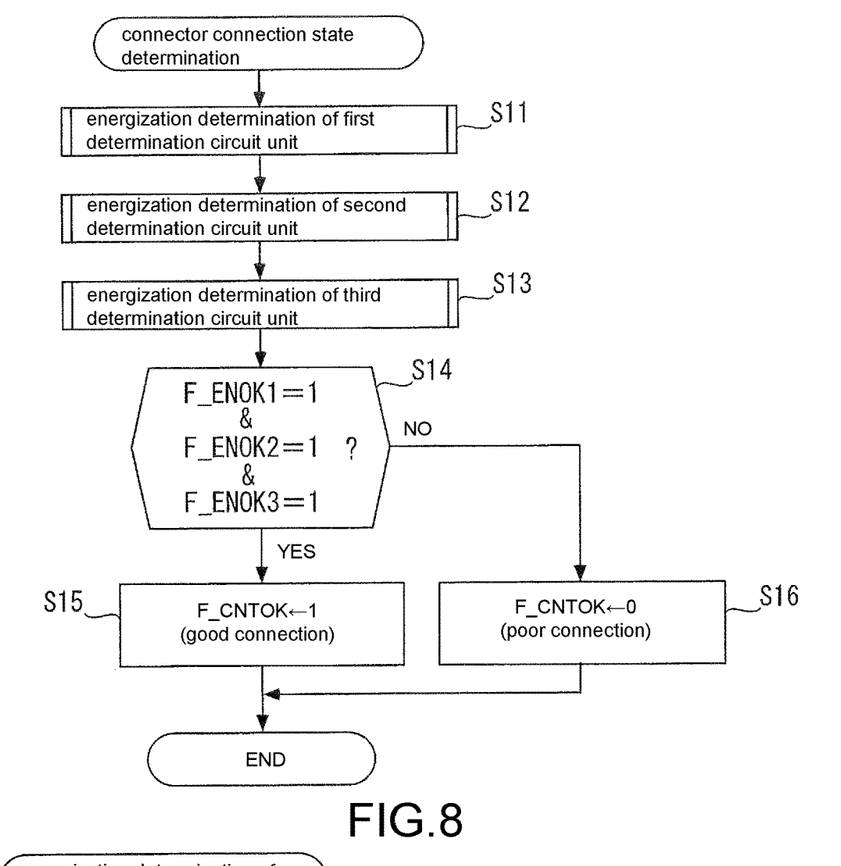
FIG. 8 is a flowchart showing a connection state determination process between the vehicle connector and the charging connector.

FIG. 8 shows a flowchart of the connection state determination process of the two connectors 2 and 3. As shown in the diagram, in this process, first, an energization determination process of the first determination circuit unit 55A is performed (step 11).

Figure 9:
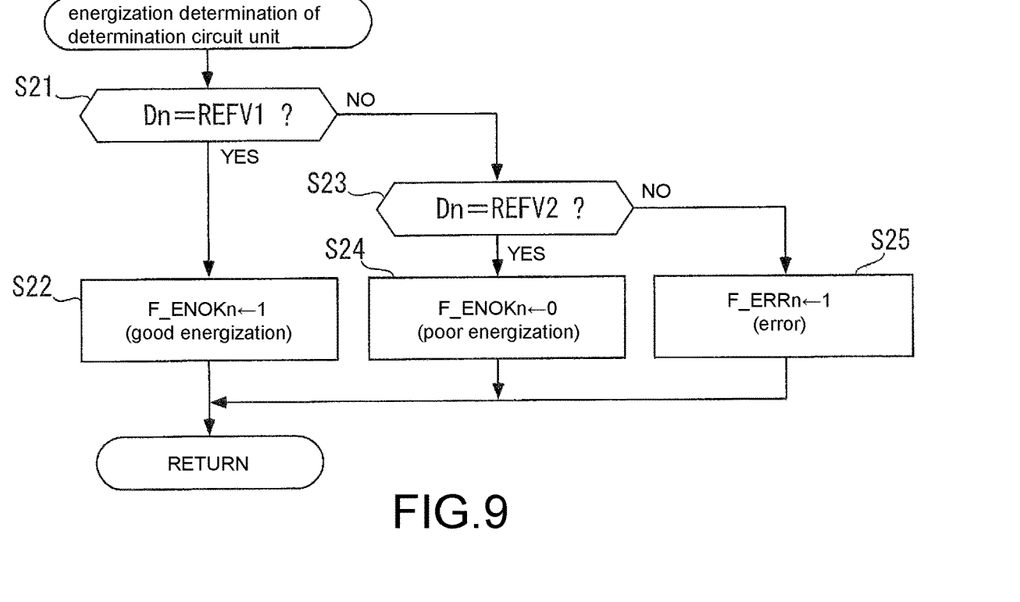
FIG. 9 is a subroutine which is used in the flowchart of FIG. 8 and shows an energization determination process of each determination circuit unit.

FIG. 9 shows a subroutine of the energization determination process of the determination circuit unit. Furthermore, the energization determination process is in common with energization determination processes of the first to the third determination circuit units 55A, 55B and 55C, and 1 to 3 are set as a subscript n recited in each step corresponding to the first to the third determination circuit unit 55A, 55B and 55C.

First, in the energization determination process, in step 21, it is determined whether a detected voltage D1 at a predetermined detection point PA of the first determination circuit unit 55A is the same as a predetermined first voltage REFV1 (for example, 2.5 V). The voltage detection point PA is positioned, as shown in FIGS. 7A and 7B, between the terminal A 23A and the resistor part A 52A of the charging connector 3. In addition, the above first voltage REFV1 is set, corresponding to a voltage of the power source A 51A and resistance values of the two resistor parts A 42A and 52A, as the voltage of the detection point PA when the terminals A 13A and 23A of the two connectors 2 and 3 are in contact with each other, that is, a partial voltage with the resistor part A 42A of the vehicle connector 2 in the resistor part A 52A of the charging connector 3. Therefore, when the detected voltage D1 at the detection point PA is equal to the first voltage REFV1, it is assumed that the terminals A 13A and 23A of the two connectors 2 and 3 are in contact with each other, and in order to express this contact, a first energization ok flag F_ENOK1 is set to "1" (step 22), and the process returns to step 11 in FIG. 8.

On the other hand, when the determination result in step 21 is NO, the process proceeds to step 23, in which it is determined whether the detected voltage D1 at the detection point PA is the same as a predetermined second voltage REVF2 (for example, 5.0 V). The second voltage REFV2 is set as a voltage at the detection point PA (the same voltage as the power source A 51A) when the terminals A 13A and 23A of the two connectors 2 and 3 are not in contact with each other. Therefore, when the detected voltage D1 at the detection point PA is equal to the second voltage REVF2, it is assumed that the terminals A 13A and 23A of the two connectors 2 and 3 are not in contact with each other, and in order to express this non-contact, the first energization ok flag F_ENOK1 is set to "0" (step 24), and the process returns to step 11 in FIG. 8.

In addition, when the determination result in step 21 is NO, that is, when the detected voltage D1 at the detection point PA is not the first voltage REFV1 nor the second voltage REFV2 being values that may be originally taken, it is assumed that a fault or the like has occurred in the first determination circuit unit 55A, and in order to express the occurrence of fault, a first error flag F_ERR1 is set to "1" (step 25), and the process returns to step 11 in FIG. 8.

Returning to FIG. 8, in steps 12 and 13 following step 11, similarly to the energization determination process of the above first determination circuit unit 55A, energization determination processes of the second determination circuit unit 55B and the third determination circuit unit 55C are performed.

Specifically, in the second determination circuit unit 55B, by comparing a detected voltage D2 at a voltage detection point PB positioned between the terminal B 23B and the resistor part B 52B of the charging connector 3 with the first voltage REFV1 or the second voltage REFV2, presence/absence of energization of the second determination circuit unit 55B or occurrence of a fault or the like is determined (steps 21 to 25). That is, a second energization ok flag F_ENOK2 is set to "1" when the terminals B 13B and 23B of the two connectors 2 and 3 are in contact with each other (step 22); on the other hand, the second energization ok flag F_ENOK2 is set to "0" when the terminals B 13B and 23B are not in contact with each other (step 24). Furthermore, a second error flag F_ERR2 is set to "1" when a fault or the like occurs in the second determination circuit unit 55B (step 25).

Similarly, in the third determination circuit unit 55C, by comparing a detected voltage D3 at a voltage detection point PC positioned between the terminal C 23C and the resistor part C 52C of the charging connector 3 with the first voltage REFV1 or the second voltage REFV2, presence/absence of energization of the third determination circuit unit 55C or occurrence of a fault or the like is determined (step 21 to 25). That is, a third energization ok flag F_ENOK3 is set to "1" when the terminals C 13C and 23C of the two connectors 2 and 3 are in contact with each other (step 22); on the other hand, the third energization ok flag F_ENOK3 is set to "0" when the terminals C 13C and 23C are not in contact with each other (step 24). Furthermore, a third error flag F_ERR3 is set to "1" when a fault or the like occurs in the third determination circuit unit 55C (step 25).

In step 14 following the above step 13 in FIG. 8, it is determined whether all of the first energization ok flag F_ENOK1, the second energization ok flag F_ENOK2 and the third energization ok flag F_ENOK3 are "1". When the determination result is YES, the three signal line terminals 23 of the charging connector 3 are respectively in appropriate contact with the corresponding three signal line terminals 13 of the vehicle connector 2 (the state shown in FIG. 7B). Therefore, the electric power line terminals 22 of the charging connector 3 are also in appropriate contact with the electric power line terminals 12 of the vehicle connector 2, and it is determined that the charging connector 3 is connected in a good state to the vehicle connector 2. Then, in order to express this connection, the connection ok flag F_CNTOK is set to "1" (step 15), and this process is ended.

On the other hand, when the determination result in the above step 14 is NO, that is, when at least one of the three signal line terminals 23 of the charging connector 3 is not in contact with the corresponding three signal line terminals 13 of the vehicle connector 2, the process proceeds to step 16, it is assumed that the connection state of the charging connector 3 with respect to the vehicle connector 2 is poor, the connection ok flag F_CNTOK is set to "0" (step 16), and this process is ended.

Figure 10A:
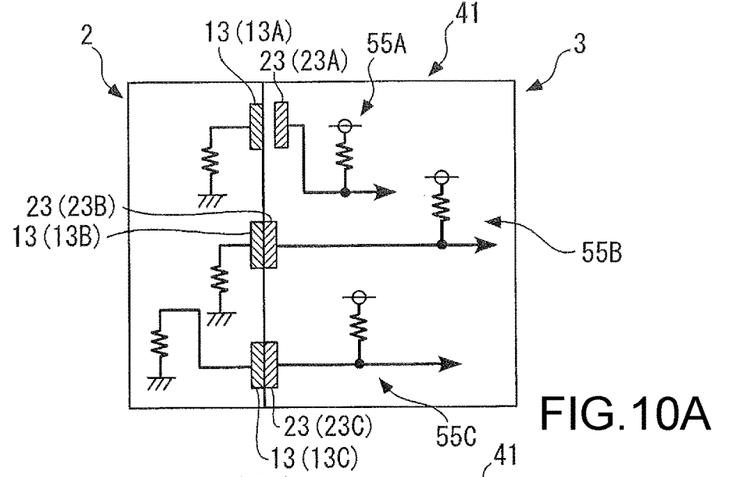
FIGS. 10A to 10C are schematic diagrams of the connector device illustrating a connection failure during connection of the vehicle connector and the charging connector.
Figure 10B:
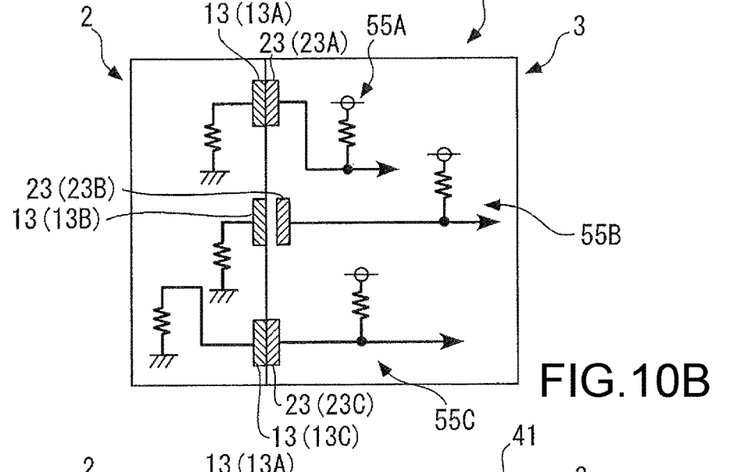
Figure 10C:
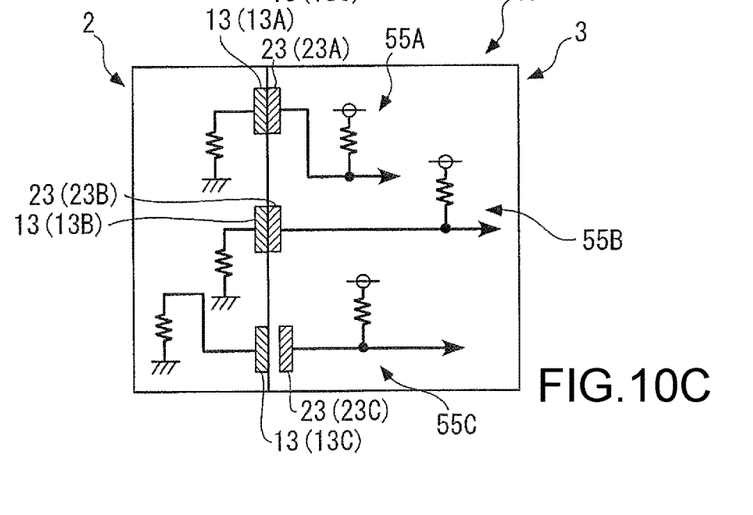

Similar to FIGS. 6A to 6C of the above-described first embodiment, FIGS. 10A to 10C illustrate a state of a connection failure when the charging connector 3 is attached to the vehicle connector 2. FIG. 10A shows a state that the terminal A 23A of the charging connector 3 is not in contact with the terminal A 13A of the vehicle connector 2, and the terminal B 23B and the terminal C 23C of the charging connector 3 are respectively in contact with the terminal B 13B and the terminal C 13C of the vehicle connector 2. In this example, according to the above-described connector connection state determination process, the first energization ok flag F_ENOK1 is "0", and the second and third energization ok flags F_ENOK2 and F_ENOK3 are "1", based on which it is determined that the terminals A 13A and 23A of the two connectors 2 and 3 are poorly connected to each other and the connection state between the two connectors 2 and 3 is poor.

In addition, FIG. 10B shows a state that the terminal B 23B of the charging connector 3 is not in contact with the terminal B 13B of the vehicle connector 2, and the terminal A 23A and the terminal C 23C of the charging connector 3 are respectively in contact with the terminal A 13A and the terminal C 13C of the vehicle connector 2. In this example, according to the above-described connector connection state determination process, the second energization ok flag F_ENOK2 is "0", and the first and third energization ok flags F_ENOK1 and F_ENOK3 are "1", based on which it is determined that the terminals B 13B and 23B of the two connectors 2 and 3 are poorly connected to each other and the connection state between the two connectors 2 and 3 is poor.

Furthermore, FIG. 10C shows a state that the terminal C 23C of the charging connector 3 is not in contact with the terminal C 13C of the vehicle connector 2, and the terminal A 23A and the terminal B 23B of the charging connector 3 are respectively in contact with the terminal A 13A and the terminal B 13B of the vehicle connector 2. In this example, according to the above-described connector connection state determination process, the third energization ok flag F_ENOK3 is "0", and the first and second energization ok flags F_ENOK1 and F_ENOK2 are "1", based on which it is determined that the terminals C 13C and 23C of the two connectors 2 and 3 are poorly connected to each other and the connection state between the two connectors 2 and 3 is poor.

As described above, when the charging connector 3 is attached to the vehicle connector 2, if it is determined that the connection state between the two connectors 2 and 3 is poor, similarly to the above-described first embodiment, after the charging connector 3 is temporarily removed from the vehicle connector 2 by the robot arm 33, the attachment operation to the vehicle connector 2 is performed again. In this case, different from the first embodiment, it is determined which of the three signal line terminals 23 of the charging connector 3 is not in contact with the corresponding three signal line terminals 13 of the vehicle connector 2, and thus, according to the determination result, the attachment operation to the vehicle connector 2 is performed while an angle of the connection surface 21a of the charging connector 3 is adjusted with high precision.

Furthermore, when a state that any of the first to the third error flags F_ERR1_F to ERR3 is "1" continues for a predetermined number of times or for a predetermined time, the attachment operation of the charging connector 3 to the vehicle connector 2 is canceled.

In addition, after the charging from the charging device 30 to the battery of the electric vehicle ends, similarly to the above-described first embodiment, the charging connector 3 is removed from the vehicle connector 2.

As described above, according to the embodiment, the same effect as that of the above-described first embodiment can be obtained. In addition, in the embodiment, when the charging connector 3 is attached to the vehicle connector 2, whether the contact state is good or poor can be determined for each of the signal line terminals 12 and 23 corresponding to each other, and thus, the attachment operation of the charging connector 3 to the vehicle connector 2 can be performed according to the determination result.

Furthermore, the disclosure is not limited to the embodiments described above and can be implemented in various aspects. For example, in the embodiments, a case is described in which the charging connector 3 of the connector devices 1, 41 is arranged at the distal end portion of the robot arm 33 of the charging device 30 and the charging connector 3 is automatically connected to the vehicle connector 2. However, the disclosure is not limited thereto and can also be applied to a manual charging device. In addition, in the two connectors 2 and 3, three signal line terminals 13 and 23 are arranged, but the disclosure is not limited thereto and two or four or more signal line terminals can also be arranged.

In addition, in the embodiments, the connection surfaces 11a and 21a of the two connectors 2 and 3 are configured to be flat. However, the disclosure is not limited thereto, one of the connection surfaces 11a and 21a may be curved in a convex shape and the other may be curved in a concave shape corresponding to the convex shape. Furthermore, in the embodiments, the electromagnets 24 are arranged in the charging connector 3. However, the disclosure is not limited thereto, and members or mechanisms capable of being attracted and repulsed with respect to the attachment and detachment magnets 14 of the vehicle connector 2 can also be employed in place of the electromagnets 24.

In addition, a lock mechanism which locks the two connectors 2 and 3 to be immovable when the charging connector 3 is appropriately attached to the vehicle connector 2 can also be arranged. Furthermore, the detailed configurations of the vehicle connector 2 and the charging connector 3 shown in the embodiments are merely examples and can be appropriately changed within the scope of the gist of the disclosure.

Other Configurations

According to one embodiment of the disclosure, a connector device 1 is provided and includes a first connector (a vehicle connector 2 in an embodiment (hereinafter, the same applies in the technical solution)) and a second connector (a charging connector 3) which are detachably connected to each other, wherein the first connector includes: a first connection surface (a connection surface 11a) which faces outward; first electric power line terminals (electric power line terminals 12) which are arranged on the first connection surface substantially coplanar with the first connection surface; and a plurality of first signal line terminals (signal line terminals 13) which is arranged on the first connection surface substantially coplanar with the first connection surface and on a radial outside of the first electric power line terminals; the second connector includes: a second connection surface (a connection surface 21a) which faces the first connection surface during the connection to the first connector; second electric power line terminals (electric power line terminals 22) which are arranged on the second connection surface substantially coplanar with the second connection surface and are in surface contact with the first electric power line terminals during a connection to the first connector; and a plurality of second signal line terminals (signal line terminals 23) which is arranged on the second connection surface substantially coplanar with the second connection surface and on a radial outside of the second electric power line terminals, and is in surface contact with the plurality of first signal line terminals respectively during the connection to the first connector.

According to this configuration, the connector device includes the first connector and the second connector which are detachably connected to each other, wherein the first connector includes the first connection surface, the first electric power line terminals and a plurality of first signal line terminals, and the second connector includes the second connection surface, the second electric power line terminals and a plurality of second signal line terminals. The first electric power line terminals and the plurality of first signal line terminals on the radial outside the of first electric power line terminals are arranged on the first connection surface of the first connector substantially coplanar with the first connection surface. On the other hand, the second electric power line terminals and the plurality of second signal line terminals on the radial outside of the second electric power line terminals are arranged on the second connection surface of the second connector substantially coplanar with the second connection surface.

When the second connector is connected to the first connector, the second connection surface of the second connector faces the first connection surface of the first connector by bringing the second connector closer to the first connector, and the second electric power line terminals and the second signal line terminals of the second connector are respectively electrically connected in a state of surface contact with the first electric power line terminals and the first signal line terminals of the first connector. In addition, since the plurality of signal line terminals of the first and second connectors are all arranged on the radial outside of the electric power line terminals, by contact between the plurality of signal line terminals of the first and second connectors, the electric power line terminals of the first and second connectors which are positioned inside these signal line terminals can be brought into contact with each other relatively easily. On the other hand, when the second connector is removed from the first connector, by separating the second connector from the first connector, the second electric power line terminals and the second signal line terminals of the second connector are respectively separated from the first electric power line terminals and the first signal line terminals of the first connector in surface contact, and the electrical connection is released.

As described above, according to the disclosure, compared with a conventional connector device, that is, a conventional connector device in which two connectors are electrically connected by fitting connector pins of one of the connectors into pin holes of the other connector, or the electrical connection between the two connectors is released by pulling the connector pins out from the pin holes, the first connector and the second connector can be easily connected and separated.

In one embodiment, the first signal line terminals include at least three first signal line terminals (a terminal A 13A, a terminal B 13B and a terminal C 13C), and the first signal line terminals are arranged on the first connection surface on a circumference of a circle or a polygon surrounding the first electric power line terminals inside, and the second signal line terminals include second signal line terminals (a terminal A 23A, a terminal B 23B and a terminal C 23C) of the same number as the first signal line terminals, and the second signal line terminals are arranged on the second connection surface on a circumference of a circle or a polygon surrounding the second electric power line terminals inside.

According to this configuration, in the first connector, on the first connection surface, at least three first signal line terminals are arranged on the circumference of a circle or a polygon surrounding the first electric power line terminals inside, and in the second connector, on the second connection surface, the second signal line terminals of the same number as the first signal line terminals are arranged on the circumference of a circle or a polygon surrounding the second electric power line terminals inside. When the second connector is connected to the first connector, all the second signal line terminals are in surface contact with all the corresponding first signal line terminals respectively, and thereby, the electric power line terminals of the first and second connectors which are positioned inside these signal line terminals can be brought into surface contact easily and reliably in a state in which the electric power line terminals are positioned three-dimensionally.

In one embodiment, the first connector further includes attachment and detachment magnets 14 which face outward from the first connection surface and are made of permanent magnets, and the second connector further includes attraction and repulsion portions (electromagnets 24) which are attracted by the attachment and detachment magnets during the connection to the first connector and can be repulsed by the attachment and detachment magnets during a detachment from the first connector.

According to this configuration, when the second connector is connected to the first connector, by bringing the second connector closer to the first connector, the attraction and repulsion portions at the second connector side are attracted by the attachment and detachment magnets at the first connector side which are made of permanent magnets, and thereby, the second connector is attracted and connected to the first connector. On the other hand, when the second connector is detached from the state that the first connector and the second connector are connected to each other, the attraction and repulsion portions which are attracted to the attachment and detachment magnets are repulsed with respect to the attachment and detachment magnets by being set to the same magnetic pole as the attachment and detachment magnet. Accordingly, using the repulsion force, the second connector can be easily detached from the first connector.

According to another embodiment, a connector connection determination device (a connector device 1) is provided and includes a first connector (a vehicle connector 2) and a second connector (a charging connector 3) which are detachably connected to each other and determining whether a connection state between the first connector and the second connector is good or poor, wherein the first connector includes: a first connection surface (a connection surface 11a) which faces outward; first electric power line terminals (electric power line terminals 12) which are arranged on the first connection surface substantially coplanar with the first connection surface; and a plurality of first signal line terminals (signal line terminals 13) which is arranged on the first connection surface substantially coplanar with the first connection surface and on a radial outside of the first electric power line terminals; the second connector includes: a second connection surface (a connection surface 21a) which faces the first connection surface during the connection to the first connector; second electric power line terminals (electric power line terminals 22) which are arranged on the second connection surface substantially coplanar with the second connection surface and are in surface contact with the first electric power line terminals during a connection to the first connector; and a plurality of second signal line terminals (signal line terminals 23) which is arranged on the second connection surface substantially coplanar with the second connection surface and on a radial outside of the second electric power line terminals, and is in surface contact with the plurality of first signal line terminals respectively during the connection to the first connector; and the connector connection determination device further includes a connection determination part (a control unit 34) for determining whether the connection state between the first connector and the second connector is good or poor according to a detection result of whether the plurality of second signal line terminals is respectively connected to the plurality of corresponding first signal line terminals when the second connector is attached to the first connector.

According to this configuration, the same operation and effect as the connector device described above can be obtained. That is, the two connectors are electrically connected by bring both the electric power line terminals and the signal line terminals of the first connector and the second connectors into surface contact with each other, and thus compared with the above-described conventional connector device, the first connector and the second connector can be easily connected and separated.

In addition, when the second connector is attached to the first connector, whether the connection state of the two connectors is good or poor is determined by the connection determination means. Specifically, when the plurality of second signal line terminals of the second connector is in contact with the plurality of corresponding first signal line terminals of the first connector, there is a high possibility that the electric power line terminals of the first and second connectors which are positioned inside these signal line terminals are also in contact with each other. Therefore, in the above case, that is, when a detection result is obtained that the plurality of first signal line terminals and the plurality of second signal line terminals are respectively in contact with each other, it is determined by the connection determination part that the connection state of the first connector and the second connector is good, and in other cases, it can be determined that the connection state between the first connector and the second connector is poor.

In one embodiment, the first signal line terminals include at least three first signal line terminals (a terminal A 13A, a terminal B 13B and a terminal C 13C), and the first signal line terminals are arranged on the first connection surface on a circumference of a circle or a polygon surrounding the first electric power line terminals inside, and the second signal line terminals include second signal line terminals (a terminal A 23A, a terminal B 23B and a terminal C 23C) of the same number as the first signal line terminals, and the second signal line terminals are arranged on the second connection surface on a circumference of a circle or a polygon surrounding the second electric power line terminals inside.

According to this configuration, the same operation and effect as the connector device described above can be obtained. That is, when the second connector is attached to the first connector, all the second signal line terminals come into surface contact with all the corresponding first signal line terminals, respectively, and thereby, the electric power line terminals of the first and second connectors which are positioned inside these signal line terminals can be easily and reliably brought into surface contact with each other in a three-dimensionally positioned state. Thereby, when the signal line terminals of the first and second connectors are in contact with each other, there is a very high possibility that the electric power line terminals are in contact with each other. Therefore, in the above case, it can be determined by connection determination means that the connection state between the first connector and the second connector is good, and in other cases, it can be determined that the connection state between the first connector and the second connector is poor. In this manner, whether the connection state between the first connector and the second connector is good or poor can be determined more appropriately.

In one embodiment, the plurality of first signal line terminals and the plurality of second signal line terminals form a predetermined first electric circuit (a determination circuit unit 32) which is electrically connected in series in a manner that the plurality of second signal line terminals is connected to the plurality of corresponding first signal line terminals respectively when the second connector is attached to the first connector; the connection determination part has an energization detection part (a control unit 34) for detecting presence/absence of energization in the first electric circuit when the first electric circuit is powered on.

According to this configuration, when the second connector is attached to the first connector, the plurality of second signal line terminals is in contact with the plurality of corresponding first signal line terminals respectively, and thereby the predetermined first electric circuit is formed. The first electric circuit is formed to be electrically connected in series, and thus if the first electric circuit is powered on, all the second signal line terminals are in contact with all the corresponding first signal line terminals when the first electric circuit is energized, from which it can be determined that the second connector is appropriately connected to the first connector and the connection state is good. On the other hand, if the first electric circuit is powered on, at least one of the second signal line terminals is not in contact with the corresponding first signal line terminal when there is no energization in the first electric circuit, from which it can be determined that the second connector is not appropriately connected to the first connector and the connection state is poor. As described above, when the second connector is attached to the first connector, it is applied to the first electric circuit, and presence/absence of the energization of the first electric circuit is detected by the energization detection part, by which whether the connection state between the first connector and the second connector is good or poor can be easily determined.

In one embodiment, the plurality of first signal line terminals and the plurality of second signal line terminals form a plurality of sets of second electric circuits (a first determination circuit unit 55A, a second determination circuit unit 55B and a third determination circuit unit 55C) as a set of electric circuits including the first signal line terminals and the second signal line terminals which are in contact with each other in a manner that each of the second signal line terminals is connected to the corresponding first signal line terminals when the second connector is attached to the first connector; and the connection determination part has a voltage detection part (a control unit 34) for detecting voltage values (detected voltages D1, D2 and D3) of predetermined positions (voltage detection points PA, PB and PC) in each of the sets of the second electric circuits when the plurality of sets of second electric circuits is powered on.

According to this configuration, when the second connector is attached to the first connector, the plurality of second signal line terminals is in contact with the plurality of corresponding first signal line terminals, and thereby the plurality of sets of second electric circuits is formed as a set of electric circuit including the first signal line terminals and the second signal line terminals which are in contact with each other. When the plurality of sets of second electric circuits is powered on, the voltages of the predetermined positions in each set of second electric circuits are, as described below, values corresponding to contact states between the first signal line terminals and the second signal line terminals included in the second electric circuits. Therefore, when the second connector is attached to the first connector, all the sets of the second electric circuits are powered on, and the voltages of the predetermined positions in each set of second electric circuits are detected by the voltage detection part, and thereby, presence/absence of the contact between the first signal line terminals and the second signal line terminals can be determined for each of the second electric circuits.

In one embodiment, the second electric circuit includes a first resistor (resistance units 42) in which one end is electrically connected to the first signal line terminals and the other end is grounded; and a second resistor (resistor parts 52) in which one end is electrically connected to the second signal line terminals and the other end is connected to an application part (power sources 51) with a predetermined voltage; and the voltage detection part detects a voltage of a side of the one end of the second resistor.

According to this configuration, in each set of the second electric circuits, the first resistors are arranged in the first connector, one ends of the first resistors are electrically connected to the first signal line terminals and the other ends are grounded. On the other hand, the second resistors are arranged in the second connector, one ends of the second resistors are electrically connected to the second signal line terminals and the other ends are connected to the application units with the predetermined voltage. When the second connector is attached to the first connector, in each set of the second electric circuits, when the second signal line terminals are in contact with the corresponding first signal line terminals, voltage values of the one ends of the second resistors which are applied on by the application part are values obtained by dividing the voltage with the first resistors. On the other hand, in each set of the second electric circuits, when the second signal line terminals are not in contact with the corresponding first signal line terminals, the voltage values of the one ends of the second resistors which are applied by the application part are the same as an applied voltage of the application part. Therefore, by detecting the voltage values of the one ends of the second resistors in each set of the second electric circuits by the voltage detection means, the presence/absence of the contact between the first signal line terminals and the second signal line terminals in the second electric circuits can be easily determined.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A connector device comprising a first connector and a second connector which are detachably connected to each other, wherein
    the first connector comprises:
    a first connection surface which faces outward;
    first electric power line terminals which are arranged on the first connection surface substantially coplanar with the first connection surface; and
    a plurality of first signal line terminals which is arranged on the first connection surface substantially coplanar with the first connection surface and on a radial outside of the first electric power line terminals;
    the second connector comprises:
    a second connection surface which faces the first connection surface during a connection to the first connector;
    second electric power line terminals which are arranged on the second connection surface substantially coplanar with the second connection surface and are in surface contact with the first electric power line terminals during the connection to the first connector; and
    a plurality of second signal line terminals which is arranged on the second connection surface substantially coplanar with the second connection surface and on a radial outside of the second electric power line terminals, and is in surface contact with the plurality of first signal line terminals respectively during the connection to the first connector,
    wherein the plurality of first signal line terminals and the plurality of second signal line terminals form a plurality of sets of electric circuits, each of the plurality of sets of the electric circuits comprises one of the plurality of second signal line terminals and a corresponding first signal line terminal among the plurality of first signal line terminals, and each of the second signal line terminals is in contact with the corresponding first signal line terminal when the second connector is attached to the first connector.

2. The connector device according to claim 1, wherein the first connector further comprises attachment and detachment magnets which face outward from the first connection surface and are made of permanent magnets, and
    the second connector further comprises attraction and repulsion portions which are attracted by the attachment and detachment magnets during the connection to the first connector and are repulsed by the attachment and detachment magnets during a detachment from the first connector.

3. The connector device according to claim 1, wherein the first signal line terminals comprise at least three first signal line terminals, and the first signal line terminals are arranged on the first connection surface on a circumference of a circle or a polygon surrounding the first electric power line terminals inside, and
    the second signal line terminals comprise second signal line terminals of the same number as the first signal line terminals, and the second signal line terminals are arranged on the second connection surface on a circumference of a circle or a polygon surrounding the second electric power line terminals inside.

4. The connector device according to claim 3, wherein the first connector further comprises attachment and detachment magnets which face outward from the first connection surface and are made of permanent magnets, and
    the second connector further comprises attraction and repulsion portions which are attracted by the attachment and detachment magnets during the connection to the first connector and are repulsed by the attachment and detachment magnets during a detachment from the first connector.

5. A connector connection determination device comprising a first connector and a second connector which are detachably connected to each other and determining whether a connection state between the first connector and the second connector is good or poor, wherein the first connector comprises:
a first connection surface which faces outward;
first electric power line terminals which are arranged on the first connection surface substantially coplanar with the first connection surface; and
a plurality of first signal line terminals which is arranged on the first connection surface substantially coplanar with the first connection surface and on a radial outside of the first electric power line terminals;
the second connector comprises:
a second connection surface which faces the first connection surface during the connection to the first connector;
second electric power line terminals which are arranged on the second connection surface substantially coplanar with the second connection surface and are in surface contact with the first electric power line terminals during a connection to the first connector; and
a plurality of second signal line terminals which is arranged on the second connection surface substantially coplanar with the second connection surface and on a radial outside of the second electric power line terminals, and is in surface contact with the plurality of first signal line terminals respectively during the connection to the first connector; and
the connector connection determination device further comprises a connection determination part for determining whether the connection state between the first connector and the second connector is good or poor according to a detection result of whether the plurality of second signal line terminals is respectively connected to the plurality of corresponding first signal line terminals when the second connector is attached to the first connector,
wherein the plurality of first signal line terminals and the plurality of second signal line terminals form a plurality of sets of electric circuits, each of the plurality of sets of the electric circuits comprises one of the plurality of second signal line terminals and a corresponding first signal line terminal among the plurality of first signal line terminals, and each of the second signal line terminals is in contact with the corresponding first signal line terminal when the second connector is attached to the first connector.

6. The connector connection determination device according to claim 5, wherein the first signal line terminals comprise at least three first signal line terminals, and the first signal line terminals are arranged on the first connection surface on a circumference of a circle or a polygon surrounding the first electric power line terminals inside, and
the second signal line terminals comprise second signal line terminals of the same number as the first signal line terminals, and the second signal line terminals are arranged on the second connection surface on a circumference of a circle or a polygon surrounding the second electric power line terminals inside.

7. The connector connection determination device according to claim 5, wherein the connection determination part has a voltage detection part for detecting voltage values of predetermined positions in each of the set of electric circuits when the set of electric circuits is powered on.

8. The connector connection determination device according to claim 7, wherein
each of the plurality of sets of the electric circuit comprise:
a first resistor in which one end is electrically connected to the first signal line terminal and the other end is grounded; and
a second resistor in which one end is electrically connected to the second signal line terminal and the other end is connected to an application part with a predetermined voltage; and
the voltage detection part detects a voltage of a side of the one end of the second resistor.

9. The connector connection determination device according to claim 6, wherein the plurality of first signal line terminals and the plurality of second signal line terminals form a plurality of sets of second electric circuits as a set of electric circuits comprising the first signal line terminals and the second signal line terminals which are in contact with each other in a manner that each of the second signal line terminals is in contact with the corresponding first signal line terminal when the second connector is attached to the first connector; and
the connection determination part has a voltage detection part for detecting voltage values of predetermined positions in each of the sets of the second electric circuits when the plurality of sets of second electric circuits is powered on.

10. The connector connection determination device according to claim 9, wherein
each of the plurality of sets of the second circuit comprise:
a first resistor in which one end is electrically connected to the first signal line terminal and the other end is grounded; and
a second resistor in which one end is electrically connected to the second signal line terminal and the other end is connected to an application part with a predetermined voltage; and
the voltage detection part detects a voltage of a side of the one end of the second resistor.

* * * * *